(12) United States Patent
Abe et al.

(10) Patent No.: US 11,201,309 B2
(45) Date of Patent: Dec. 14, 2021

(54) DISPLAY UNIT AND ELECTRONIC APPARATUS INCLUDING A DIVIDED ELECTRODE

(71) Applicant: JOLED INC., Tokyo (JP)

(72) Inventors: Kaoru Abe, Tokyo (JP); Jiro Yamada, Tokyo (JP); Kazuma Teramoto, Tokyo (JP); Kenichi Nendai, Tokyo (JP); Hideki Kobayashi, Tokyo (JP); Masaki Nishimura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/183,663

(22) Filed: Nov. 7, 2018

(65) Prior Publication Data

US 2019/0074471 A1 Mar. 7, 2019

Related U.S. Application Data

(63) Continuation of application No. PCT/JP2017/015896, filed on Apr. 20, 2017.

(30) Foreign Application Priority Data

May 11, 2016 (JP) .............................. JP2016-095343

(51) Int. Cl.
*H01L 29/08* (2006.01)
*H01L 51/52* (2006.01)
(Continued)

(52) U.S. Cl.
CPC ...... *H01L 51/5209* (2013.01); *H01L 27/3246* (2013.01); *H01L 51/5225* (2013.01);
(Continued)

(58) Field of Classification Search
CPC ............. H01L 51/5209; H01L 27/3246; H01L 51/5225; H01L 51/5253; H01L 51/56;
(Continued)

(56) References Cited

U.S. PATENT DOCUMENTS 6,339,289 B1 * 1/2002 Fork .................... H01L 51/5203
313/500
9,111,887 B2 * 8/2015 Kim .................... H01L 51/5253
(Continued)

FOREIGN PATENT DOCUMENTS

JP 2003-243182 A 8/2003
JP 2006-260792 A 9/2006
(Continued)

OTHER PUBLICATIONS

Office Action in JP Application No. 2018-516919, dated Apr. 9, 2019. 6pp.
(Continued)

*Primary Examiner* — Caleb E Henry
(74) *Attorney, Agent, or Firm* — Hauptman Ham, LLP

(57) ABSTRACT

A display unit is provided with a plurality of pixels. The plurality of pixels each include a first electrode, an insulating film, an organic layer, and a second electrode. The insulating film is provided on the first electrode, and has openings. The organic layer is provided in each of the openings of the insulating film, and includes a light-emitting layer. The second electrode is provided on the organic layer. The first electrode includes a plurality of sub-electrodes that are provided to face the respective openings of the insulating film.

18 Claims, 15 Drawing Sheets

(51) Int. Cl.
  *H01L 27/32* (2006.01)
  *H01L 51/56* (2006.01)
(52) U.S. Cl.
  CPC .......... *H01L 51/5253* (2013.01); *H01L 51/56* (2013.01); *H01L 51/5218* (2013.01); *H01L 51/5271* (2013.01); *H01L 2251/5392* (2013.01); *H01L 2251/568* (2013.01)
(58) Field of Classification Search
  CPC ......... H01L 51/5218; H01L 2251/5392; H01L 51/5271; H01L 2251/568
  USPC ........................................................ 257/40
  See application file for complete search history.

(56) References Cited

U.S. PATENT DOCUMENTS

| | | | | |
|---|---|---|---|---|
| 2002/0180372 | A1* | 12/2002 | Yamazaki | H01L 51/5088 315/169.3 |
| 2005/0040756 | A1* | 2/2005 | Winters | H01L 51/5265 313/504 |
| 2005/0116620 | A1* | 6/2005 | Kobayashi | H01L 51/5271 313/503 |
| 2005/0218792 | A1* | 10/2005 | Jianpu | H01L 27/3213 313/502 |
| 2005/0225233 | A1* | 10/2005 | Boroson | H01L 51/5265 313/504 |
| 2007/0046186 | A1 | 3/2007 | Kim | |
| 2007/0286944 | A1* | 12/2007 | Yokoyama | H01L 51/5265 427/66 |
| 2010/0148192 | A1* | 6/2010 | Jung | H01L 51/5284 257/88 |
| 2010/0253215 | A1* | 10/2010 | Fukagawa | H01L 51/5259 313/504 |
| 2014/0070182 | A1* | 3/2014 | Choi | H01L 27/3246 257/40 |
| 2014/0306200 | A1 | 10/2014 | Jinta et al. | |
| 2014/0346444 | A1 | 11/2014 | Chung et al. | |
| 2016/0315125 | A1* | 10/2016 | Kikuchi | H01L 27/322 |

FOREIGN PATENT DOCUMENTS

| | | |
|---|---|---|
| JP | 2006-294364 A | 10/2006 |
| JP | 2007-66904 A | 3/2007 |
| JP | 2009-288735 A | 12/2009 |
| JP | 2011-34849 A | 2/2011 |
| JP | 2014-207105 A | 10/2014 |
| JP | 2014-225329 A | 12/2014 |
| JP | 2015-144087 A | 8/2015 |
| KR | 1020070037091 A | 4/2007 |
| TW | 201318240 A1 | 5/2013 |

OTHER PUBLICATIONS

International Search Report in PCT/JP2017/015896, dated Jul. 4, 2017. 4pp.

* cited by examiner

DISPLAY UNIT AND ELECTRONIC APPARATUS INCLUDING A DIVIDED ELECTRODE

CROSS REFERENCE TO RELATED APPLICATIONS

This is a continuation of International Application No. PCT/JP2017/015896, filed Apr. 20, 2017, which claims the benefit of Japanese Priority Patent Application JP2016-095343, filed May 11, 2016 the entire contents of which are incorporated herein by reference.

BACKGROUND

The disclosure relates to a display unit using an organic electroluminescence (EL) element, and an electronic apparatus including the display unit.

When foreign matters are mixed into an organic layer during a manufacturing process, for example, in an organic EL display unit, an electrical short circuit occurs between an anode and a cathode, causing, in some cases, occurrence of pixel defect that is referred to as a dark spot. A technique of repairing such a short-circuited location has been proposed. For example, reference is made to Japanese Unexamined Patent Application Publication (JP-A) No. 2009-288735.

SUMMARY

In a method disclosed in JP-A No. 2009-288735, however, a light-emitting region is halved in a pixel in which a dark spot occurs, thus lowering luminance.

It is desirable to provide a display unit that makes it possible to improve image quality by suppressing lowering of luminance caused by a dark spot.

A display unit according to an embodiment of the disclosure is provided with a plurality of pixels. The plurality of pixels each include a first electrode, an insulating film, an organic layer, and a second electrode. The first electrode includes a plurality of sub-electrodes. The insulating film is provided on the first electrode, and has openings that face the respective sub-electrodes of the insulating film. The organic layer is provided in each of the openings of the insulating film, and includes a light-emitting layer. The second electrode is provided on the organic layer.

An electronic apparatus according to an embodiment of the disclosure includes a display unit. The display unit is provided with a plurality of pixels. The plurality of pixels each include a first electrode, an insulating film, an organic layer, and a second electrode. The first electrode includes a plurality of sub-electrodes. The insulating film is provided on the first electrode, and has openings that face the respective sub-electrodes of the insulating film. The organic layer is provided in each of the openings of the insulating film, and includes a light-emitting layer. The second electrode is provided on the organic layer.

A display unit according to an embodiment of the disclosure is provided with a plurality of pixels. The plurality of pixels each include a first electrode, an insulating film, at least a light-emitting layer, and a second electrode. The first electrode includes a plurality of sub-electrodes. The insulating film is provided on the first electrode, and has openings that face the respective sub-electrodes. At least a light-emitting layer is provided in each of the openings of the insulating film. A second electrode is provided above the light-emitting layer.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

Figure 1:
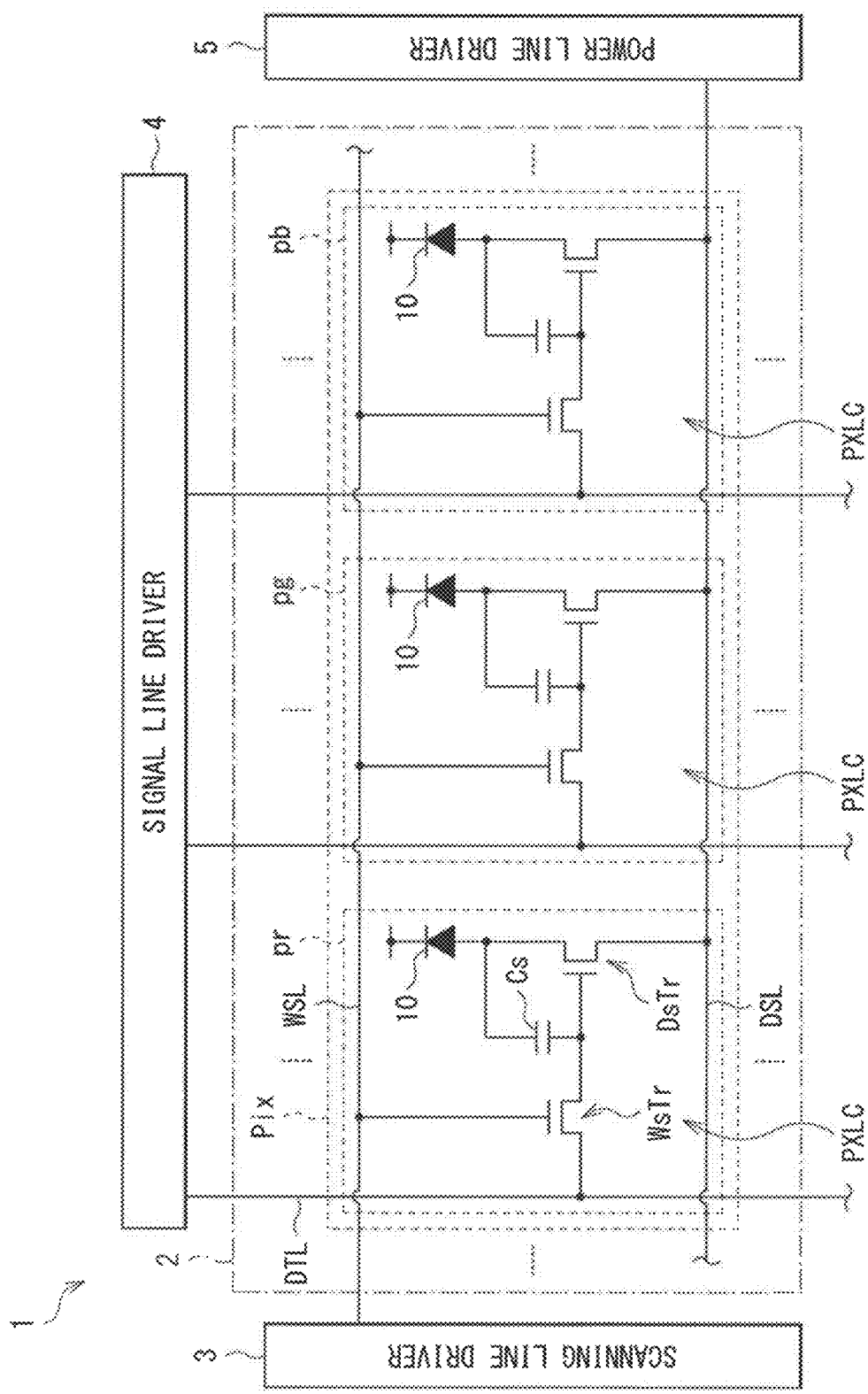
FIG. 1 is a block diagram illustrating an overall configuration of a display unit according to one embodiment of the disclosure.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. Example Embodiment (An example in which a first electrode is divided into a plurality of sub-electrodes and an opening having a reflector is provided for each sub-electrode)

2. Modification Examples 1-1 to 1-3 (Other examples in which sub-electrodes are disposed in a stripe form)

3. Modification Examples 2-1 and 2-2 (Examples in which sub-electrodes each have a circular surface shape and an elliptical surface shape)

4. Modification Examples 3-1 and 3-2 (Other examples of a direction in which sub-electrodes are divided)

5. Modification Example 4 (Another example of a surface shape of a first electrode)

6. Modification Example 5 (Another configuration example of a pixel section)

7. Application Example (An example of an electronic apparatus)

Example Embodiment

[Configuration]

FIG. 1 illustrates an overall configuration of a display unit (e.g., a display unit 1) according to an embodiment of the disclosure. The display unit 1 may be, for example, an organic EL display including an organic electroluminescent element. The display unit 1 may be a top emission display unit which outputs, for example, light of any of R (red), G (green), and B (blue) from top face side. The display unit 1 may include, for example, a pixel section 2 and a circuit section that drives the pixel section 2. The circuit section may include a scanning line driver 3, a signal line driver 4, and a power line driver 5. The pixel section 2 may include a plurality of pixels pr, pg, and pb that are arranged two-dimensionally.

The pixel section 2 may display an image, by means of an active matrix scheme, for example, on the basis of an image signal inputted from an external device.

There may be provided, in the pixel section 2, a plurality of scanning lines WSL each extending in a row direction of pixel arrangement, a plurality of signal lines DTL each extending in a column direction, and a plurality of power lines DSL each extending in the row direction. The scanning lines WSL, the signal lines DTL, and the power lines DSL may be electrically coupled to each of the pixels pr, pg, and pb. The pixels pr, pg, and pb may each correspond to a subpixel, for example. A set of the pixels pr, pg, and pb may configure one pixel, i.e., a pixel Pix.

Figure 2:
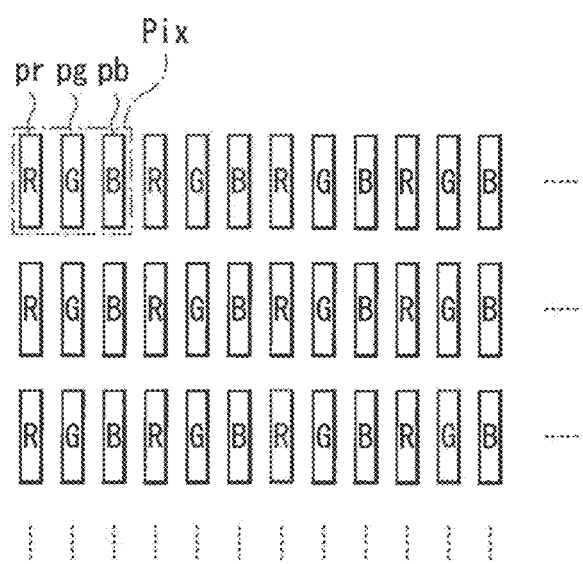
FIG. 2 is a schematic view of arrangement of pixels illustrated in FIG. 1. the display unit illustrated in FIG. 1.

FIG. 2 illustrates an example of a planar configuration of the pixel Pix, i.e., the pixels pr, pg, and pb illustrated in FIG. 1. The pixels pr, pg, and pb may each have a rectangular surface shape, for example, and may be arranged in a stripe shape as a whole. Pixels of the same emission color may be arranged in a direction (i.e., a column direction in FIG. 2) along a long side of a rectangular shape of each of the pixels pr, pg, and pb. The pixel pr may display a red color (R), for example. The pixel pg may display a green color (G), for example. The pixel pb may display a blue color (B), for example. The pixels pr, pg, and pb may each include a pixel circuit PXLC that includes an organic EL element 10.

Hereinafter, the pixels pr, pg, and pb are each referred to as a "pixel P" for description in a case where no particular distinction is necessary.

The pixel circuit PXLC may control light emission and light extinction in each of the pixels pr, pg, and pb. The pixel circuit PXLC may include the organic EL element 10, a storage capacitor Cs, a switching transistor WsTr, and a driving transistor DsTr, for example. Note that, in this example, a circuit configuration of 2Tr1C is exemplified as the pixel circuit PXLC; however, the configuration of the pixel circuit PXLC is not limited thereto. The pixel circuit PXLC may have a circuit configuration in which components such as various capacitors and transistors are further added to the 2Tr1C circuit.

The switching transistor WsTr may control application of an image signal, i.e., a signal voltage to a gate electrode of the driving transistor DsTr. In a specific but non-limiting example, the switching transistor WsTr may sample a voltage, i.e. a signal voltage, of the signal line DTL in response to a voltage applied to the scanning line WSL, and may write the signal voltage into the gate electrode of the driving transistor DsTr. The driving transistor DsTr may be coupled in series to the organic EL element 10, and may control a current that flows to the organic EL element 10 in accordance with magnitude of the signal voltage sampled by the switching transistor WsTr. The driving transistor DsTr and the switching transistor WsTr may be each configured by an n-channel MOS or p-channel MOS thin film transistor (TFT), for example. The driving transistor DsTr and the switching transistor WsTr may be each a single-gate transistor or a dual-gate transistor. The storage capacitor Cs may retain a predetermined voltage between the gate electrode and a source electrode of the driving transistor DsTr.

The switching transistor WsTr has a gate electrode that may be coupled to the scanning line WSL. The switching transistor WsTr has a source electrode and a drain electrode; one electrode thereof may be coupled to the signal line DTL, and the other electrode thereof may be coupled to the gate electrode of the driving transistor DsTr. The driving transistor DsTr has the source electrode and a drain electrode; one electrode thereof may be coupled to the power line DSL, and the other electrode thereof may be coupled to an anode, i.e., a first electrode 14 of the organic EL element 10 described later. The storage capacitor Cs may be provided between the gate electrode of the driving transistor DsTr and an electrode on side of the organic EL element 10.

The scanning line WSL may supply a selection pulse to each of the pixels P. The selection pulse may be used to select, on a row basis, a plurality of pixels P arranged in the pixel section 2. The scanning line WSL may be coupled to an unillustrated output end of the scanning line driver 3 and to the gate electrode of the switching transistor WsTr described later. The signal line DTL may supply, to each of the pixels P, a signal pulse (i.e., a signal electric potential Vsig and a reference electric potential Vofs) based on the image signal. The signal line DTL may be coupled to an unillustrated output end of the signal line driver 4 and to the source electrode or the drain electrode of the switching transistor WsTr described later. The power line DSL may supply, to each of the pixels P, a fixed electric potential (Vcc) as power. The power line DSL may be coupled to an unillustrated output end of the power line driver 5 and to the source electrode or the drain electrode of the driving transistor DsTr described later. Note that the organic EL element 10 has a cathode, i.e., a second electrode 17 described later that may be coupled to a common electric potential line, i.e., a cathode line.

The scanning line driver 3 may output a predetermined selection pulse to each of the scanning lines WSL line-sequentially to thereby cause each of the pixels P to execute each of operations such as anode reset, Vth compensation, writing of the signal electric potential Vsig, mobility compensation, and light emission operation, for example, at a predetermined timing. The signal line driver 4 may generate an analog image signal corresponding to a digital image signal inputted from an external device, and may output the generated analog image signal to each of the signal lines DTL. The power line driver 5 may output a fixed electric potential to each of the power lines DSL. The scanning line driver 3, the signal line driver 4, and the power line driver 5 may be controlled to operate in conjunction with one another, on the basis of a timing control signal outputted by an unillustrated timing controller. A digital image signal inputted from the external device may be compensated by an unillustrated image signal receiver. Thereafter, the resultant digital image signal may be inputted to the signal line driver 4.

Description is given below of a detailed configuration of the pixel section 2.

Figure 3:
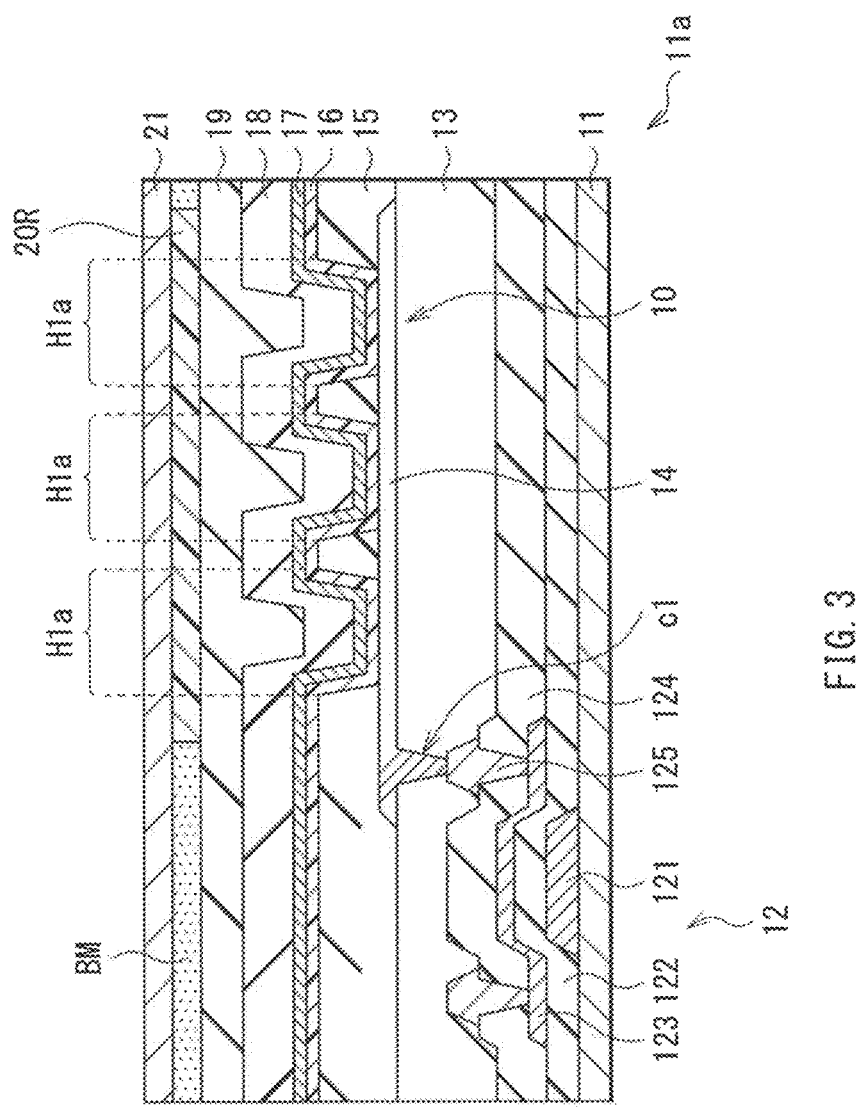
FIG. 3 is a cross-sectional view of a configuration of a portion of a pixel section illustrated in FIG. 1.

FIG. 3 illustrates a cross-sectional configuration of a portion of the display unit 1, i.e., the pixel section 2. In the pixel section 2, a plurality of organic EL elements 10 may be two-dimensionally disposed on a drive substrate 11a; FIG. 3, however, only illustrates a region corresponding to one organic EL element 10, i.e., a region corresponding to the pixel Pr that displays a red color. A second substrate 21 may be joined onto the organic EL element 10, with a second insulating film 18, a sealing layer 19, a color filter layer (such as a red filter 20R, a green filter 20G, and a blue filter 20B), and a black matrix layer BM, for example, being interposed therebetween.

The drive substrate 11a may have a configuration in which a pixel circuit (e.g., the pixel circuit PXLC illustrated in FIG. 1) including a TFT 12 is provided on a first substrate 11 configured by glass or plastic, for example. A surface of the drive substrate 11a may be planarized by a planarizing film 13.

The TFT 12 may correspond to the driving transistor DsTr illustrated in FIG. 1, for example. The TFT 12 may include, for example, a gate electrode 121 in a selective region on the first substrate 11, and a semiconductor layer 123 on the gate electrode 121 with a gate insulating film 122 interposed therebetween. An interlayer insulating film 124 may be provided on the semiconductor layer 123. A pair of source-drain electrodes 125 may be provided on the interlayer insulating film 124. The source-drain electrodes 125 may be electrically coupled to the semiconductor layer 123 through contact holes provided in the interlayer insulating film 124. One of the source-drain electrodes 125 may be electrically coupled to the first electrode 14 through a contact part c1 (e.g., an anode contact). Note that, in this example, the TFT 12 having a so-called bottom gate structure is exemplified; however, this is not limitative. A TFT 12 having a so-called top gate structure may also be adopted.

The gate electrode 121 may include, for example, one or more of metals such as molybdenum (Mo), titanium (Ti), aluminum (Al), tungsten (W), and chromium (Cr). The gate insulating film 122 and the interlayer insulating film 124 may each include, for example, one or more of silicon oxide ($SiO_2$), silicon nitride ($SiN_x$), and silicon oxynitride (SiON), for example. The semiconductor layer 123 may be configured, for example, by a silicon-based semiconductor such as amorphous silicon, polycrystalline silicon (i.e., polysilicon), and microcrystalline silicon. Alternatively, the semiconductor layer 123 may be configured, for example, by an oxide semiconductor such as indium-gallium-zinc oxide (InGaZnO) and zinc oxide (ZnO). The source-drain electrodes 125 may each include, for example, one or more of metals such as molybdenum, titanium, aluminum, tungsten, and chromium.

The planarizing film 13 may be configured, for example, by an organic insulating material such as polyimide and an acrylic resin.

[Configuration of Organic EL Element 10]

The organic EL element 10 may be provided on the drive substrate 11a for each of the pixels pr, pg, and pb. As illustrated in FIG. 3, the organic EL element 10 may include an organic layer 16 and the second electrode 17 on the first electrode 14. A plurality of first electrodes 14 may be disposed on the drive substrate 11a, and may be covered with a first insulating film 15. The first insulating film 15 corresponds to a specific but non-limiting example of an "insulating film" according to one embodiment of the disclosure. The first insulating film 15 has a plurality of openings, i.e., openings H1a that face each of the first electrodes 14. The organic layer 16 is provided in each of the openings H1a of the first insulating film 15.

The first electrode 14 may be a reflective electrode that serves as an anode, for example, and may be provided for each of the pixels P. Non-limiting examples of a constituent material of the first electrode 14 may include a simple substance and an alloy of a metal element such as aluminum (Al), chromium (Cr), gold (Au), platinum (Pt), nickel (Ni), copper (Cu), tungsten (W), and silver (Ag). Further, the first electrode 14 may include a stacked film of a metal film and a transparent electrically conductive film. The metal film may be made of a simple substance or an alloy of the above-mentioned metal elements. The transparent electrically conductive film may include an electrically conductive material having light-transmissivity. Non-limiting examples of the transparent electrically conductive film may include indium-tin oxide (ITO), indium-zinc oxide (IZO), and a zinc oxide (ZnO)-based material. Non-limiting examples of the zinc oxide-based material may include aluminum (Al)-doped zinc oxide (AZO) and gallium (Ga)-doped zinc oxide (GZO).

Figure 4:
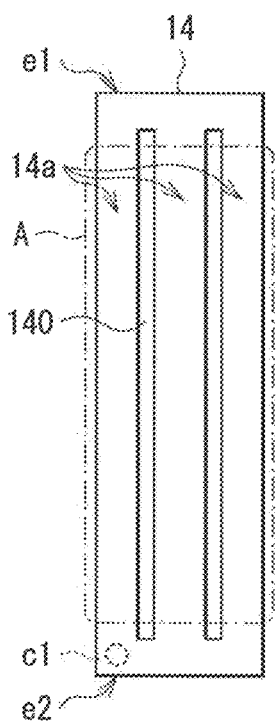
FIG. 4 is a plan view of a configuration example of a first electrode illustrated in FIG. 3.

FIG. 4 illustrates a planar configuration of the first electrode 14. In the present example embodiment, at least a portion of the first electrode 14 may be divided (i.e., segmented) into a plurality of sub-electrodes (i.e., sub-electrode parts) 14a. In this example, three sub-electrodes 14a may be provided in a region A, of the first electrode 14, that contributes to light emission. Each of the sub-electrodes 14a may be provided to face the opening H1a of the first insulating film 15. The three sub-electrodes 14a may be coupled, or electrically coupled together at ends (i.e., ends e1 and e2) of the first electrode 14. In other words, the first electrode 14 may have a plurality of (in this example, two) slits 140, each of which may extend along a long-side direction of the rectangular shape of the first electrode 14. The slits 140 may divide the first electrode 14 (more particularly, a portion of the first electrode 14) into a plurality of sub-electrodes 14a in the region A. The region A may be divided along the long-side direction of the rectangular shape of the first electrode 14. In the display unit 1, a portion of a region of the first electrode 14 (i.e., a region 14a1 corresponding to a short-circuited location on the sub-electrode 14a described later) may be selectively cut in a selective pixel P.

The first electrode 14 may have, for example, a rectangular shape of a surface that is parallel to a surface of the substrate. The sub-electrode 14a may have, for example but not limited to, a rectangular surface shape with a long side being along the long-side direction of the rectangular shape of the first electrode 14, although. In the first electrode 14, the plurality of sub-electrodes 14a may be disposed in a stripe shape, for example. In this example, the sub-electrodes 14a may each have a rectangular shape extending in a single direction. In other words, the sub-electrodes 14a may be each disposed to extend straight along the single direction. However, the sub-electrodes 14a may be disposed in a serpentine fashion, or may be disposed in a zig-zag fashion. Further, the sub-electrodes 14a may be each partially bent or curved. Moreover, the widths, sizes, and shapes, for example, of the sub-electrodes 14a may be the same as or different from one another.

The first insulating film 15 may define a light-emitting region of each of the pixels P and may ensure an insulation property between the first electrode 14 and the second electrode 17. The first insulating film 15 may also serve as a so-called partition wall in a case where the organic layer 16 is formed by means of a wet process. The first insulating film 15 may include, for example, a photosensitive resin such as an acrylic resin, a polyimide resin, a fluorine resin, a silicon resin, a fluorine polymer, a silicon polymer, a novolak resin, an epoxy resin, and a norbornene resin. Alternatively, any of these resin materials with a pigment dispersed therein may also be used. Further, for example, an inorganic material such as silicon oxide, silicon nitride, and silicon oxynitride may also be used for the first insulating film 15.

Figure 5:
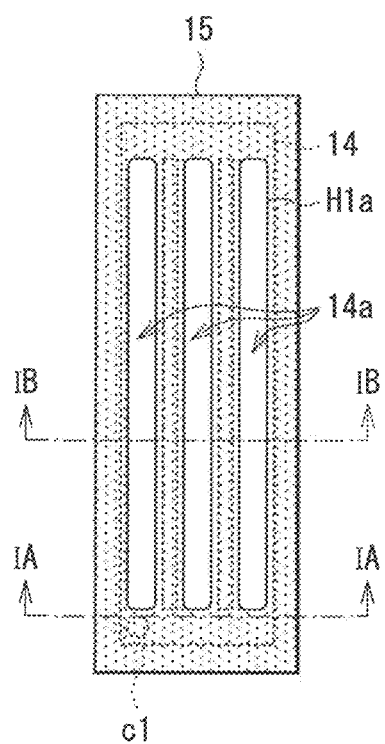
FIG. 5 is a plan view of a configuration of a first insulating film illustrated in FIG. 3, together with the configuration of the first electrode.
Figure 6:
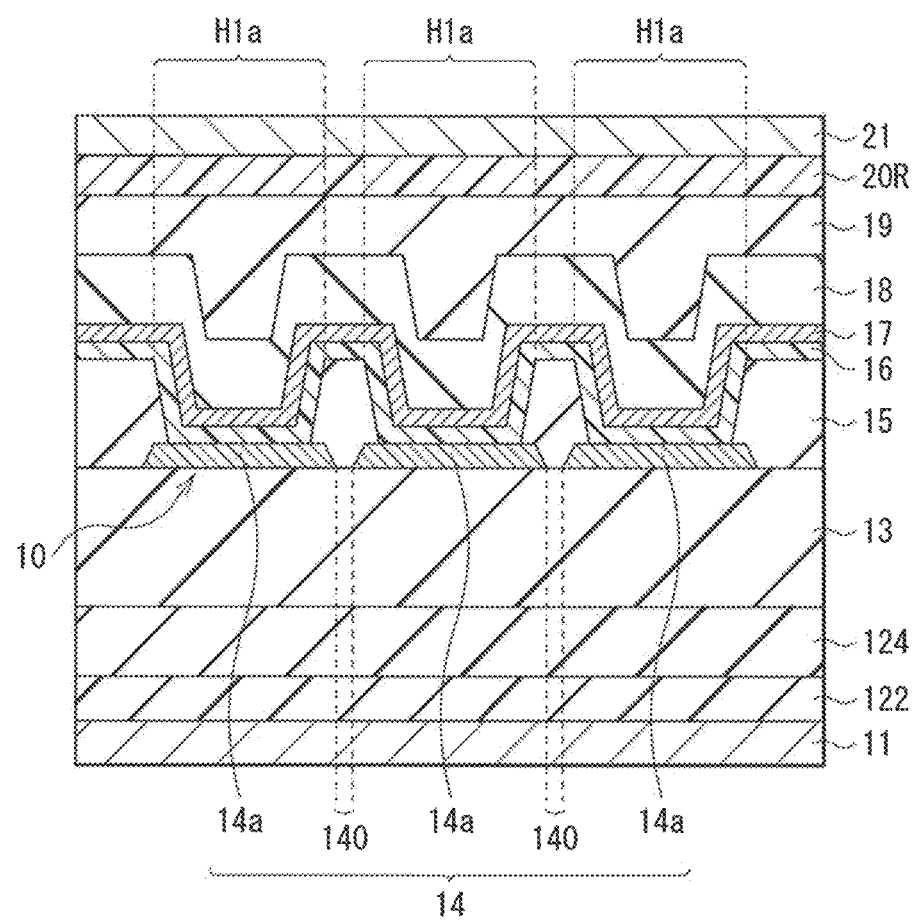
FIG. 6 is a cross-sectional view of a configuration illustrated in FIG. 5 taken along a line IB-IB.

FIG. 5 illustrates a planar configuration of the first insulating film 15, together with a planar configuration of the first electrode 14. FIG. 6 illustrates a cross-sectional configuration taken along a line IB-IB in FIG. 5. The configuration illustrated in FIG. 3 corresponds to a cross-sectional configuration taken along a line IA-IA in FIG. 5. The first insulating film 15 may have the plurality of (in this example, three) openings H1a that face one first electrode 14. The openings H1a may be provided to face the respective sub-electrodes 14a. In other words, regions, of the first insulating film 15, that face the respective sub-electrodes 14a may be opened. On a bottom surface of each of the openings H1a, for example, the sub-electrode 14a, the organic layer 16, and the second electrode 17 may be stacked in this order. In the present example embodiment, one organic EL element 10 may thus have three effective light-emitting regions defined by the three openings H1a.

In an example embodiment, the opening H1a of the first insulating film 15 may include, for example, a reflector (i.e., a reflective structure) 40 as described below. One reason for this is that a light extraction efficiency is improved, thus making it possible to enhance luminance, i.e., to suppress lowering of luminance caused by a dark spot.

Figure 7:
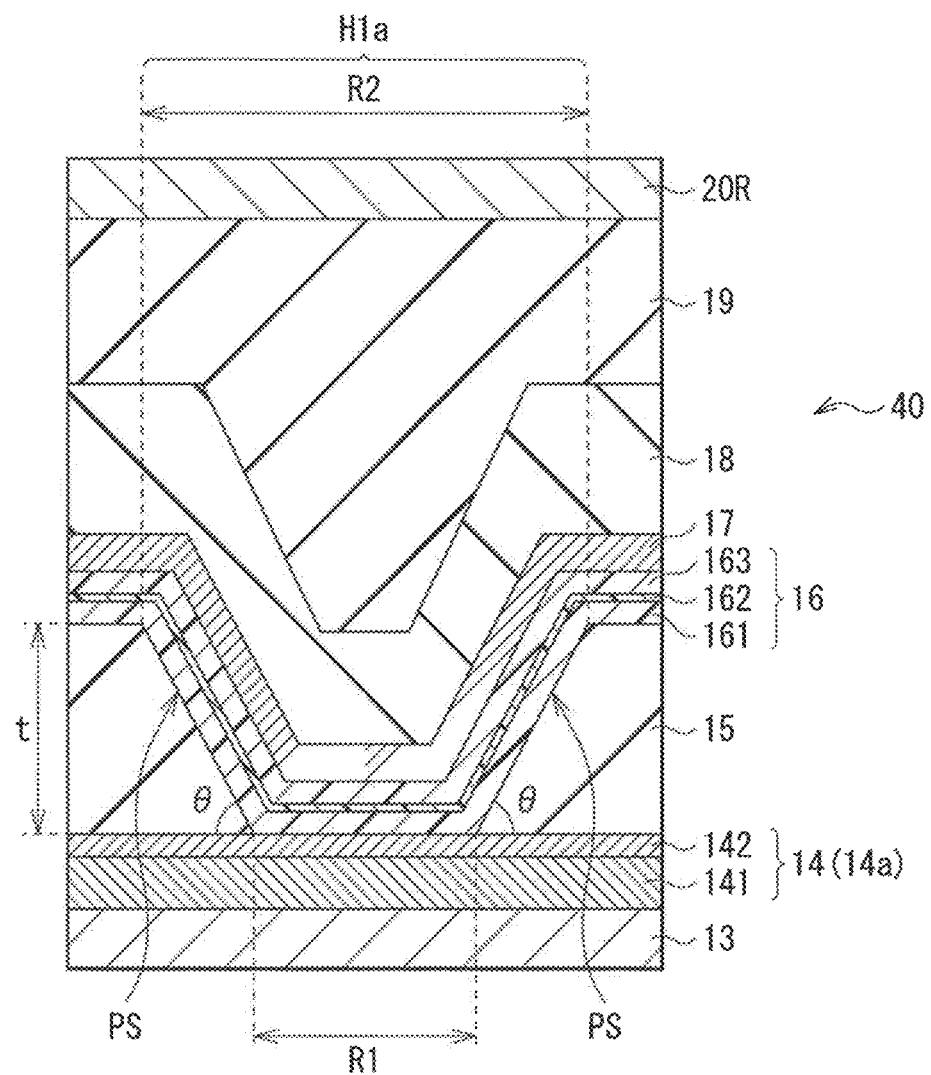
FIG. 7 is a cross-sectional view of a detailed configuration of an opening (reflector) illustrated in FIG. 3

FIG. 7 illustrates a detailed configuration of a region near the opening H1a. The reflector 40 may guide light generated from the organic layer 16, in a frontal direction by reflection, utilizing a reflection interface formed near an inclined surface PS of the first insulating film 15. The reflector 40 may be configured depending on, for example, a combination of a constituent material (refractive index) of the first insulating film 15, a shape and an inclination angle θ of the inclined surface PS of the opening H1a, and a constituent material (refractive index) of each of the second insulating film 18 and the sealing layer 19. Note that FIG. 7 illustrates a case where the first electrode 14 (i.e., the sub-electrode 14a) has a stacked structure of an Al alloy layer 141 and an ITO layer 142 and where the organic layer 16 includes a hole injection/transport layer 161, a light-emitting layer 162, and an electron transport layer 163 in order from side of the first electrode 14. In other words, the second electrode 17 is provided above the light-emitting layer 162.

In an example embodiment, a refractive index of the first insulating film 15 may be different from a refractive index of the second insulating film 18. One reason for this is that a difference in the refractive indexes between the first insulating film 15 and the second insulating film 18 causes the reflection interface to be formed. In an example embodiment, a refractive index n2 of the second insulating film 18 and a refractive index n1 of the first insulating film 15 may satisfy the following expressions (1) and (2). This enables light to be efficiently reflected at the reflection interface between the first insulating film 15 and the second insulating film 18.

$$1.1 \leq n2 \leq 1.8 \tag{1}$$

$$n2-n1 \geq 0.20 \tag{2}$$

In an example embodiment, a thickness (i.e., height) of the first insulating film 15, an opening length R1 of the opening H1a on lower end side, and an opening length R2 of the opening H1a on upper end side may satisfy the following expressions (3) and (4). This enables light to be efficiently reflected at the reflection interface between the first insulating film 15 and the second insulating film 18.

$$R1/R2<1.0 \tag{3}$$

$$0.5 \leq t/R1 \leq 2.0 \tag{4}$$

The organic layer 16 may include, for example, an organic electroluminescent layer that generates white light, and may be provided as a common layer for the plurality of pixels pr, pg, and pb inside the pixel section 2, for example. The organic electroluminescent layer corresponds to a specific but non-limiting example of a "light-emitting layer" according to one embodiment of the disclosure. Optionally, the organic layer 16 may include, in addition to the light-emitting layer, a hole injection layer, a hole transport layer, and an electron transport layer, for example. The light-emitting layer included in the organic layer 16 may have a configuration in which, for example, a red light-emitting layer, a green light-emitting layer, and a blue light-emitting layer are stacked. In an alternative embodiment, the light-emitting layer may have a configuration in which, for example, a yellow light-emitting layer and a blue light-emitting layer are stacked. Further, the light-emitting layer may be provided as a light-emitting layer having a different color for each of the pixels pr, pg, and pb. In this case, the organic layer 16 provided in the pixel pr may include the red light-emitting layer; the organic layer 16 provided in the pixel pg may include the green light-emitting layer; and the organic layer 16 provided in the pixel ph may include the blue light-emitting layer.

The second electrode 17 may serve as a cathode, for example, and may be provided across the entire surface of the pixel section 2. In other words, the second electrode 17 may be provided as an electrode common to all of the pixels P. The second electrode 17 may be configured by a transparent electrically conductive film, for example. Non-limiting examples of a material of the transparent electrically conductive film may include indium-tin oxide (ITO), indium-zinc oxide (IZO), and a zinc oxide (ZnO)-based material. Non-limiting examples of the zinc oxide-based material may include aluminum (Al)-doped zinc oxide (AZO) and gallium (Ga)-doped zinc oxide (GZO). Although a thickness of the second electrode 17 is not particularly limited, the thickness may be set in consideration of electrical conductivity and light-transmissivity. In addition to these materials, an alloy of magnesium and silver (an Mg—Ag alloy) may also be used for the second electrode 17.

The second insulating film 18 may cover the second electrode 17, and may be configured by silicon nitride, for example. The second insulating film 18 may enhance reflection efficiency of the above-described reflector 40, and may also serve as a protective film that suppresses or prevents moisture ingress into the organic EL element 10 and that suppresses or prevents variation in characteristics such as light emission efficiency.

The sealing layer 19 may join the second insulating film 18 and the second substrate 21 together, and may seal the organic EL element 10. Non-limiting examples of a material of the sealing layer 19 may include an acrylic resin, a polyimide resin, a fluorine resin, a silicon resin, a fluorine polymer, a silicon polymer, a novolak resin, an epoxy resin, and a norbornene resin. Alternatively, any of these resin materials with a pigment dispersed therein may also be used.

The color filter layers, i.e., the red filter 20R, the green filter 20G, and the blue filter 20B may extract white light beams generated at the organic EL elements 10, as color light beams of red (R), green (G), and blue (B), respectively. The color filter layer may be provided on a surface of the second substrate 21, e.g., on a surface of the second substrate 21 on side of the sealing layer 19. The red filter 20R, the green filter 20G, and the blue filter 20B may be provided in regions facing the organic EL elements 10 for the pixels pr, pg, and pb, respectively. These red filters 20R, green filters 20G, and blue filters 20B may be each configured by a resin with a pigment mixed therein.

The black matrix layer BM may be provided in a region between the above-described red filter 20R, green filter 20G, and blue filter 20B, i.e., in a region between pixels. The black matrix layer BM may be configured, for example, by a resin film with a black colorant mixed therein, or by a thin film filter utilizing interference of a thin film. The thin film filter may have a configuration in which, for example, one or more thin films made of a material such as metal, a metal nitride, and a metal oxide are stacked to attenuate light by utilizing the interference of the thin films. Specific but non-limiting examples of the thin film filter may include a filter in which chromium (Cr) and chromium(III) oxide ($Cr_2O_3$) are stacked alternately.

The second substrate 21, together with the sealing layer 19, may seal the organic EL element 10. The second substrate 21 may be configured, for example, by a material such as glass or plastic that is transparent to light generated in the organic EL element 10.

[Defect Repair]

Description is given next of repair of a pixel defect generated in the above-described display unit 1. In the display unit 1, foreign matters may be mixed into the organic layer 16 due to a manufacturing process, for example, thus causing an electrical short circuit between the first electrode 14 and the second electrode 17 in some cases. The pixel P in which such an electrical short circuit occurs may turn into a dark spot, i.e., a pixel defect. In an example embodiment, the short-circuited location may be irradiated with laser light, for example, to repair the pixel defect.

Figure 8:
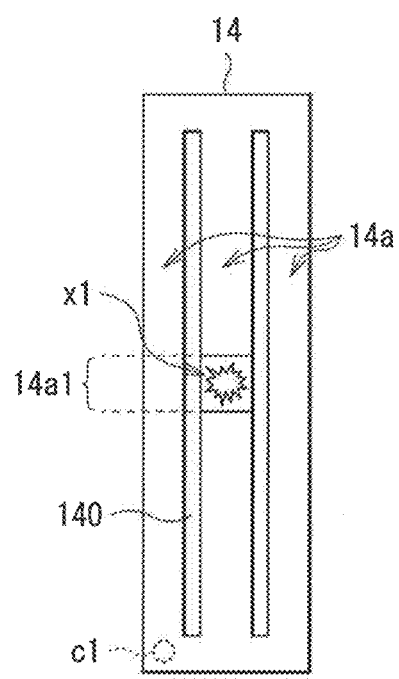
FIG. 8 is an explanatory schematic view of defect repair using the first electrode illustrated in FIG. 4.

As described above, in the display unit 1 according to the present example embodiment, the first electrode 14 may include the plurality of sub-electrodes 14a. Description is given of defect repair, in this configuration, in a case where an electrical short circuit (i.e., a short circuit x1) occurs due to foreign matters as illustrated in FIG. 8, for example. In the present example embodiment, a portion of a region, of the first electrode 14, including a location where the short circuit x1 occurs (i.e., a location into which foreign matters are mixed) may be selectively cut by means of laser irradiation, for example. The portion of the region including the location where the short circuit x1 occurs corresponds to the region 14a1 that is a portion of the sub-electrode 14a. Examples of a laser to be used for the repair may include, but not particularly limited to, a laser being able to process the metal or the transparent electrically conductive film that configures the first electrode 14, such as a solid state laser including a fiber laser and a YAG laser.

Figure 9A:
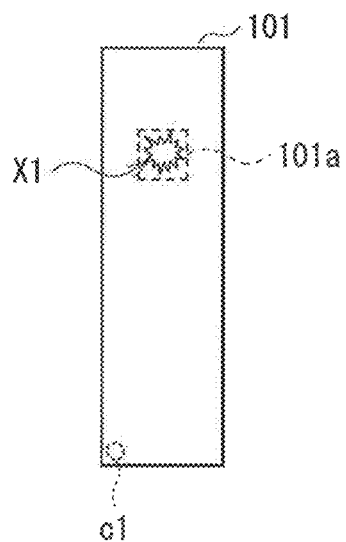
FIG. 9A is an explanatory schematic view of defect repair according to Comparative Example 1.

Description is given here of defect repair in a case where a first electrode, i.e., a first electrode 101 is not divided, as Comparative Examples 1 and 2 of the present example embodiment. For example, in Comparative Example 1 illustrated in FIG. 9A, in a case where the short circuit x1 occurs on a portion of the first electrode 101 due to foreign matters, a location (i.e., a part 101a) where the short circuit x1 occurs is selectively cut by means of laser irradiation. In the case of Comparative Example 1, however, laser light scans along the part 101a including the short circuit x1, i.e., to surround the location where the short circuit x1 occurs, thus making it difficult to perform the repair.

Figure 9B:
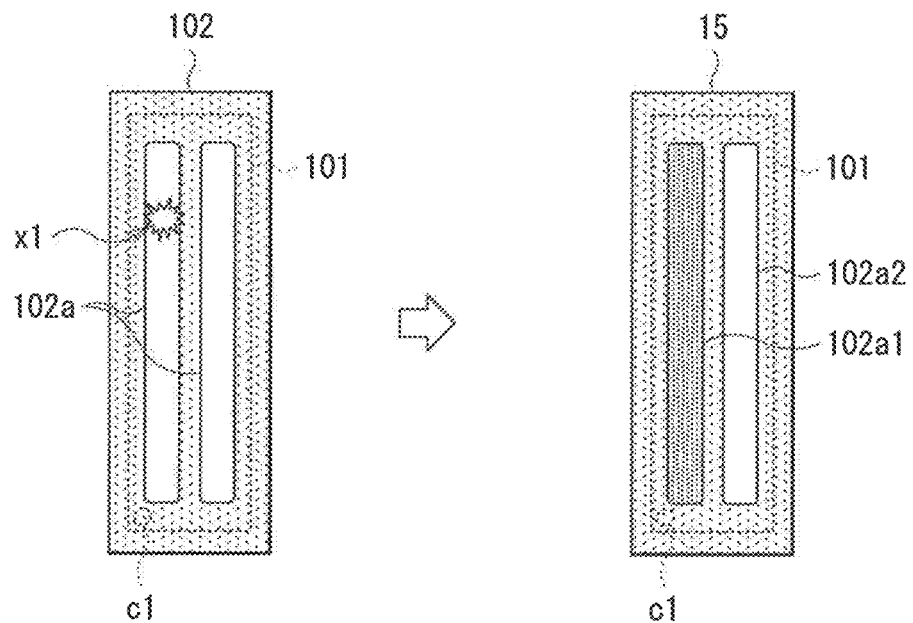
FIG. 9B is an explanatory schematic view of defect repair according to Comparative Example 2.

Further, in Comparative Example 2 illustrated in FIG. 9B, an insulating film 102 having two openings 102a, for example, is provided on the first electrode 101 that is similar to that of the foregoing Comparative Example 1, as illustrated in the left figure of FIG. 9B. In this configuration, in a case where the short circuit x1 occurs on a portion of the first electrode 101, an unillustrated organic layer provided in the opening 102a that has the short circuit x1 is irradiated with laser light. With this laser light irradiation, as illustrated in the right figure of FIG. 9B, one of the two openings 102a having the short circuit x1 (i.e., an opening 102a1) is turned into a dark spot, i.e., a non-light-emitting region, whereas the other of the two openings 102a (i.e., an opening 102a2) is allowed to emit light normally. In this Comparative Example 2, however, a pixel where the short circuit x1 occurs has a narrowed light-emitting region, i.e., has a roughly halved light-emitting region, thus leading to lowered luminance.

Figure 10:
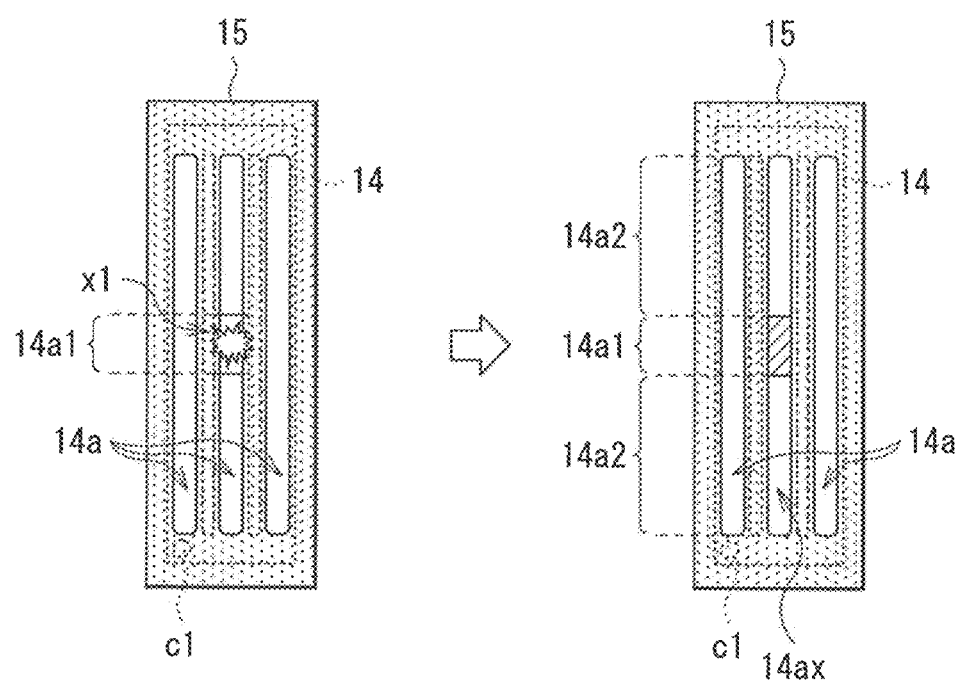
FIG. 10 is an explanatory schematic view of effects obtained by the defect repair illustrated in FIG. 8.

In contrast, in the present example embodiment, only the region 14a1, that is a portion of the first electrode 14, corresponding to the short circuit x1 may be selectively cut by laser irradiation upon the defect repair, as illustrated in the left figure of FIG. 10. At this occasion, the first electrode 14 divided (i.e., segmented) into the plurality of sub-electrodes 14a allows for linear cutting at a portion of the sub-electrodes 14a, for example, at two locations that interpose the location where the short circuit x1 occurs. Thus, it becomes easier to perform the repair by means of laser irradiation than the foregoing Comparative Example 1. Further, as illustrated in the right figure of FIG. 10, the defect repair allows only the selective region 14a1 including the short circuit x1, out of the sub-electrode 14a (i.e., a sub-electrode 14ax) including the short circuit x1, to be physically separated from other regions (i.e., regions 14a2). This enables two sub-electrodes 14a in which no short circuit x1 occurs as well as the regions 14a2 of the sub-electrode 14ax to emit light normally. As described above, it is possible to perform more efficient defect repair than Comparative Example 1 in which the first electrode 14 is not divided. Further, it is possible to secure a larger light-emitting region than Comparative Example 2.

[Workings and Effects]

In the display unit 1 according to the present example embodiment, a selection pulse may be supplied to the switching transistor WsTr of each of the pixels P from the scanning line driver 3 to select a pixel P. A signal voltage corresponding to an image signal supplied from the signal line driver 4 may be supplied to the selected pixel P, and the supplied signal voltage may be stored in the storage capacitor Cs.

The driving transistor DsTr may be subjected to ON/OFF control in response to the signal stored by the storage capacitor Cs, and a drive current may be flowed into the organic EL element 10. This allows for generation of light emission through recombination of holes and electrons in the organic EL element 10, i.e., in the organic electroluminescent layer. The light may be extracted, for example, through the second electrode 17, the second insulating film 18, the sealing layer 19, the color filter layer (such as the red filter 20R, the green filter 20O, and the blue filter 20B), and the second substrate 21. This causes red light, green light, and blue light to be outputted from the pixels P, i.e., the pixels pr, pg, and pb, respectively. Additive color mixture of the color beams allows color image display to be performed.

In the present example embodiment, the first electrode 14 that configures the organic EL element 10 of each of the pixels pr, pg, and pb includes the plurality of sub-electrodes 14a. This makes it possible to selectively cut a portion, of the sub-electrode 14a, corresponding to a short-circuited location, upon repairing the pixel defect due to the electrical short circuit between the first electrode 14 and the second electrode 17, as described above. In other words, it is possible to suppress the dark spot (i.e., pixel defect) within a minimum range inside the pixel, and to physically separate other normal parts from the dark spot part so that the separated normal parts serve as the light-emitting region. This makes it possible to perform more efficient repair and to secure a larger light-emitting region than a case where the first electrode 14 is not divided. Hence, it becomes possible to improve display image quality by suppressing lowering of luminance caused by a dark spot.

Figure 11:
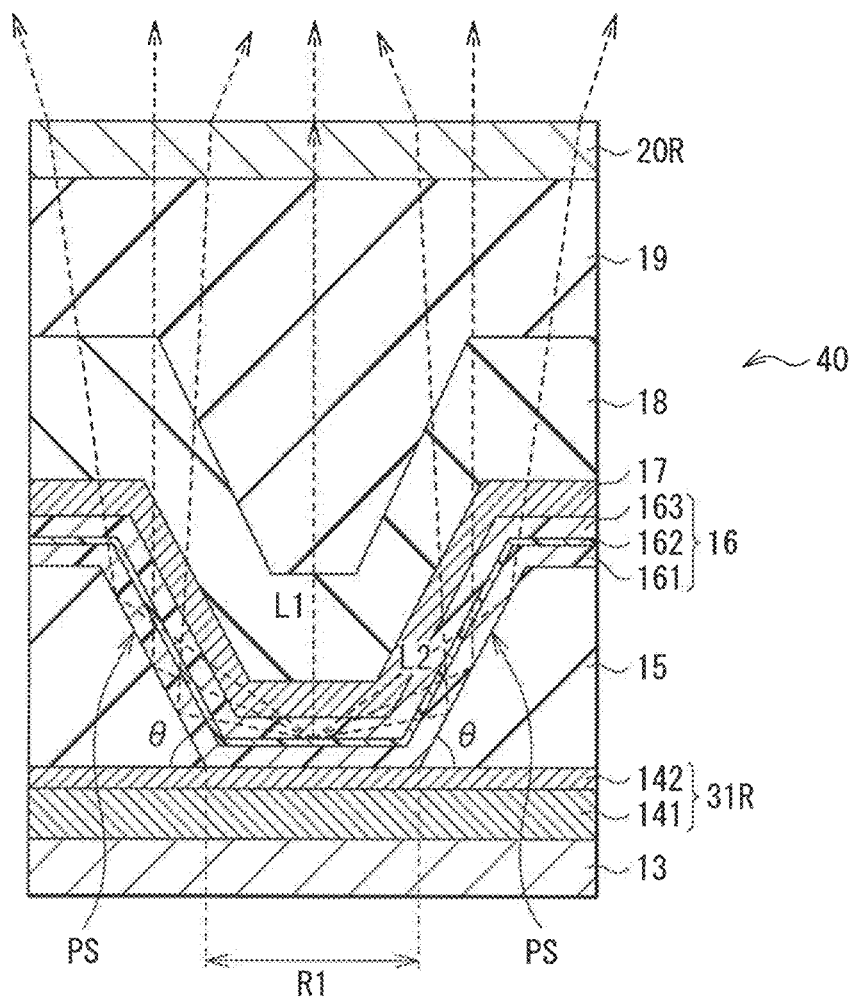
FIG. 11 is an explanatory schematic view of effects obtained by the opening illustrated in each of FIGS. 3 and 7.

Moreover, the reflector 40 included in the opening H1a of the first insulating film 15 brings the following advantage. FIG. 11 schematically describes effects obtained by the opening H1a (i.e., the reflector 40). Light outputted from the light-emitting layer 162 of the organic layer 16 by the above-described light emission driving includes, in addition to light L1 that travels in the frontal direction, light L2 that travels in a direction (i.e., an oblique direction) shifted from the frontal direction. The light L2 is reflected at the inclined surface PS of the opening H1a, and is raised in the frontal direction. The reflector 40 included in the opening H1a makes it possible to improve a light extraction efficiency and thus to enhance luminance.

In particular, in the present example embodiment, the region (i.e., the region 14a1 in FIG. 10), that is a portion of the sub-electrode 14a, corresponding to the short-circuited location is turned into a dark spot. The region 14a1 is a narrow region as compared with the entire region of the first electrode 14, and thus the above-described effect of reflection at the reflector 40 makes it possible to easily compensate local lowering of luminance due to the region 14a1. In other words, the configuration in which the first electrode 14 is divided into the plurality of the sub-electrodes 14a and in which the reflector 40 is provided makes it possible to repair the pixel defect while effectively suppressing lowering of luminance, thus allowing for achievement of a display with high luminance.

Description is given below of modification examples of the foregoing example embodiment. Note that components similar to those of the foregoing example embodiment are denoted by the same reference numerals, and description thereof is omitted where appropriate.

Modification Examples 1-1 to 1-3

Figure 12A:
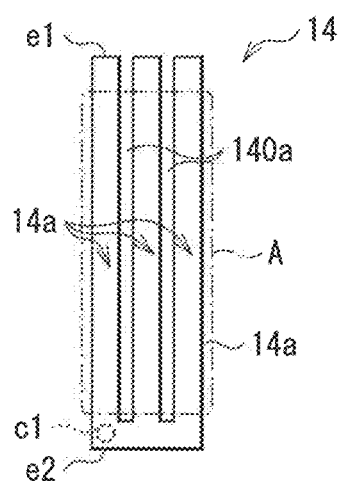
FIG. 12A is a plan view of a configuration of a first electrode according to Modification Example 1-1.
Figure 12B:
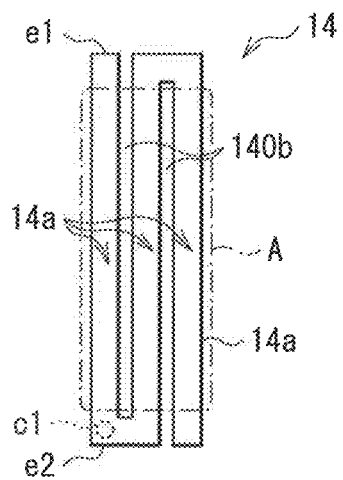
FIG. 12B is a plan view of a configuration of a first electrode according to Modification Example 1-2.
Figure 12C:
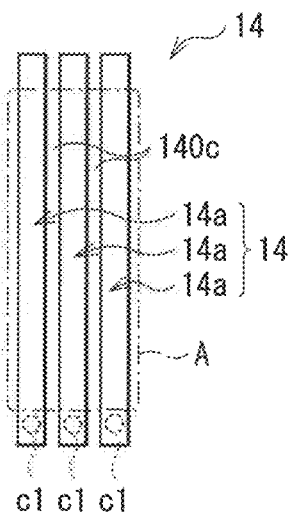
FIG. 12C is a plan view of a configuration of a first electrode according to Modification Example 1-3.

FIG. 12A illustrates a configuration of the first electrode 14 according to Modification Example 1-1. FIG. 12B illustrates a configuration of the first electrode 14 according to Modification Example 1-2. FIG. 12C illustrates a configuration of the first electrode 14 according to Modification Example 1-3. The foregoing example embodiment exemplifies the configuration in which the three sub-electrodes 14a may be disposed in a stripe shape in the first electrode 14, and the sub-electrodes 14a may be coupled together at ends (i.e., the ends e1 and e2). However, the configuration of the ends of the sub-electrodes 14a in the first electrode 14 is not limited thereto, and may take various forms. Configurations described below are also merely exemplary.

For example, the three sub-electrodes 14a may be coupled together only at one end (the end e2 in this example) as in Modification Example 1-1 illustrated in FIG. 12A. In other words, the first electrode 14 may have a plurality of (in this example, two) cut-outs 140a. Each of the cut-outs 140a may have an opening at one of the ends e1 and e2 (at the end e1 in this example), and may extend along a long-side direction of the sub-electrode 14a. Further, the three sub-electrodes 14a may be disposed to be folded back (i.e., bent) alternately in the ends e1 and e2 as in Modification Example 1-2 illustrated in FIG. 12B. In other words, the first electrode 14 may have a plurality of (in this example, two) cut-outs 140b. One of the cut-outs 140b may have an opening on side of the end e1, and may extend along the long-side direction of the sub-electrode 14a. The other of the cut-outs 140b may have an opening on side of the end e2, and may extend along the long-side direction of the sub-electrode 14a.

In each case of these Modification Examples 1-1 and 1-2, the three sub-electrodes 14a may be electrically coupled together, thus making it possible to supply each of the sub-electrodes 14a with a voltage via one contact part c1. However, as in Modification Example 1-3 illustrated in FIG. 12C, the sub-electrodes 14a may be electrically separated from one another in the first electrode 14. In other words, the first electrode 14 may have a plurality of (in this example, two) spacings (i.e., spacings 140c), thereby being divided into the plurality of sub-electrodes 14a. In this case, the contact part c1 may be disposed for each of the sub-electrodes 14a.

In this manner, the first electrode 14 may include the plurality of sub-electrodes 14a in the region A that contributes to light emission, for example, and configurations in the ends e1 and e2 (i.e., regions other than the region A) are not particularly limited. Further, the number of the division of the first electrode 14 (i.e., the number of the sub-electrodes 14a) within the region A is not limited to three as described above, and may be two or more, or may be four or more.

Modification Examples 2-1 and 2-2

Figure 13A:
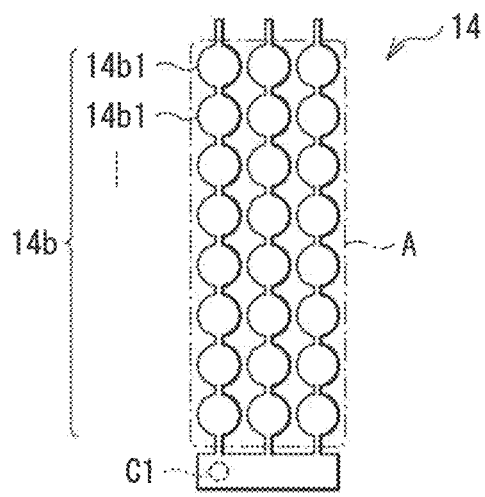
FIG. 13A is a plan view of a configuration of a first electrode according to Modification Example 2-1.
Figure 13B:
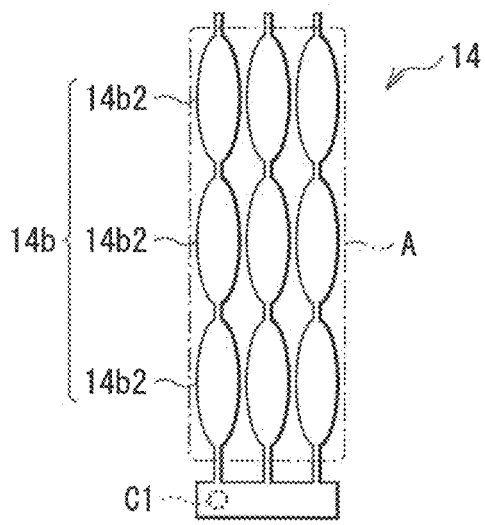
FIG. 13B is a plan view of a configuration of a first electrode according to Modification Example 2-2.

FIG. 13A illustrates a configuration of a first electrode 14 according to Modification Example 2-1. FIG. 13B illustrates a configuration of a first electrode 14 according to Modification Example 2-2. The foregoing example embodiment exemplifies the case where the sub-electrode 14a may have a rectangular surface shape; however, the surface shape of the sub-electrode 14a is not limited to the rectangular shape. The sub-electrode 14a may have various surface shapes. Configurations described here are also merely exemplary.

As in Modification Example 2-1 illustrated in FIG. 13A, for example, each of three sub-electrodes (i.e., sub-electrodes 14b) in the first electrode 14 may include a circular part 14b1. In this case, for example, a plurality of circular parts 14b1 are disposed to be coupled, i.e., electrically coupled in one of the sub-electrodes 14b. Further, as in Modification Example 2-2 illustrated in FIG. 13B, each of the three sub-electrodes 14b in the first electrode 14 may include an elliptical part 14b2. In this case, for example, a plurality of elliptical parts 14b2 are disposed to be coupled, i.e., electrically coupled in one of the sub-electrodes 14b. In each of the configurations, for example, the sub-electrodes 14b may be electrically coupled together in the region other than the region A of the first electrode 14, and may be each supplied with a voltage through one contact part c1. In cases of these Modification Examples 2-1 and 2-2, the first insulating film 15 may be provided with the opening H1a including the reflector 40 for each of the circular parts 14b1 or for each of the elliptical parts 14b2, in an example embodiment. Further, the sub-electrode 14b is not limited to the above-described circular shape and elliptical shape, and may include a polygonal part. The polygonal part may have three sides or five sides or more.

Modification Examples 3-1 and 3-2

Figure 14A:
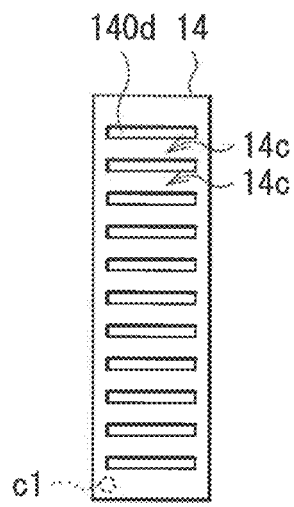
FIG. 14A is a plan view of a configuration of a first electrode according to Modification Example 3-1.
Figure 14B:
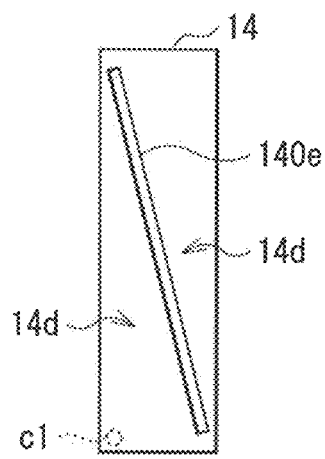
FIG. 14B is a plan view of a configuration of a first electrode according to Modification Example 3-2.

FIG. 14A illustrates a configuration of a first electrode 14 according to Modification Example 3-1. FIG. 14B illustrates a configuration of a first electrode 14 according to Modification Example 3-2. The foregoing example embodiment describes the case where the first electrode 14 is divided along the long-side direction of its rectangular shape; however, the direction of the division of the first electrode 14 is not limited thereto.

For example, as in Modification Example 3-1 illustrated in FIG. 14A, the first electrode 14 may be divided along a short-side direction of its rectangular shape. In other words, the first electrode 14 may be provided with a plurality of slits 140d each extending in the short-side direction. The slits 140d may allow for formation of a plurality of sub-electrodes 14c each extending in the short-side direction. Further, as in Modification Example 3-2 illustrated in FIG. 14B, the first electrode 14 may be divided along a diagonal direction (i.e., an oblique direction) of its rectangular shape. In other words, the first electrode 14 may be provided with a slit 140e extending in the oblique direction. The slits 140e may allow for formation of two sub-electrodes 14d.

Modification Example 4

Figure 15:
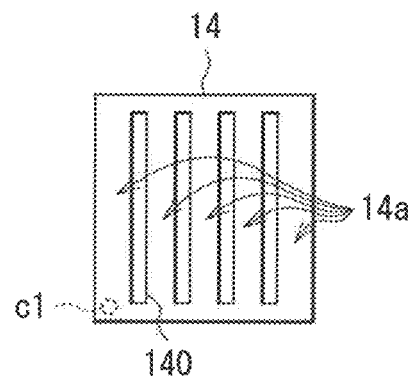
FIG. 15 is a plan view of a configuration of a first electrode according to Modification Example 4.

FIG. 15 illustrates a configuration of a first electrode 14 according to Modification Example 4. The foregoing example embodiment and modification examples exemplify the configuration in which the first electrode 14 has a rectangular surface shape; however, the surface shape of the first electrode 14 is not limited to the rectangular shape. For example, as in the present modification example, the first electrode 14 having a square shape may also be used. In this case as well, similarly to the foregoing example embodiment and modification examples, disposition of a plurality of (in this example, five) sub-electrodes 14a via the slits 140 makes it possible to achieve effects similar to those of the foregoing example embodiment.

Modification Example 5

Figure 16:
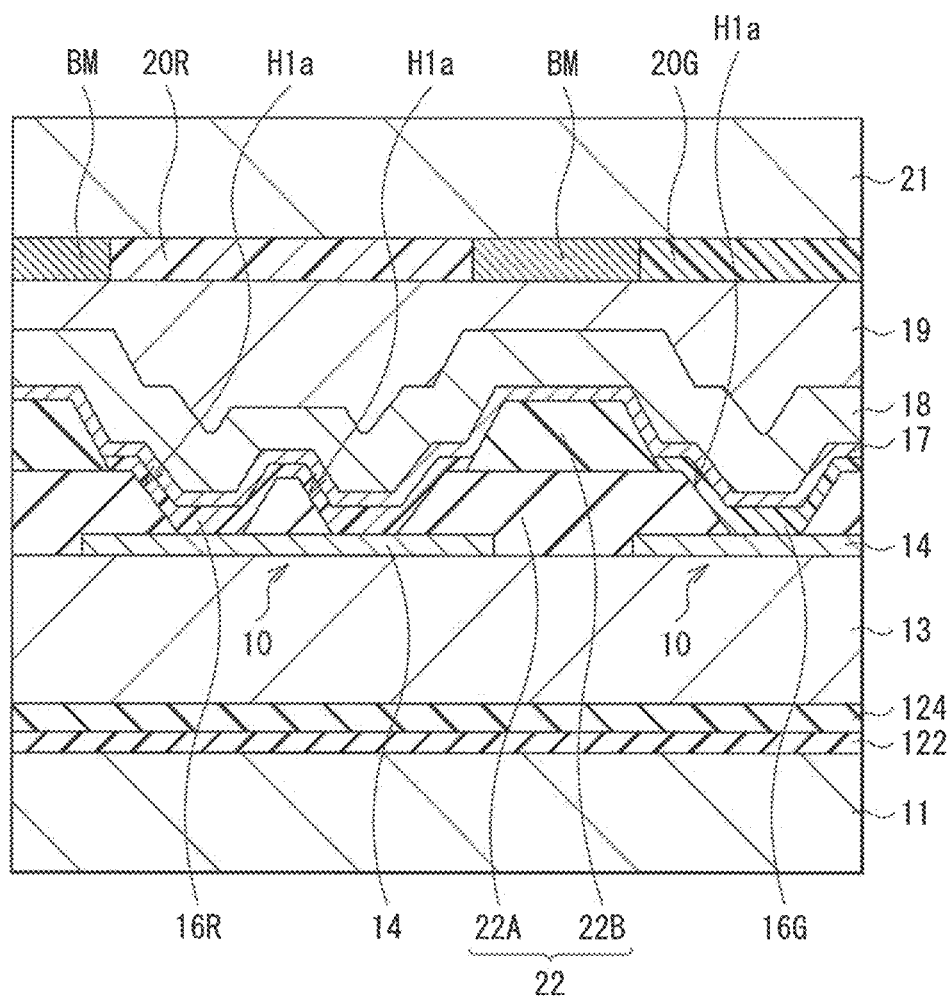
FIG. 16 is a cross-sectional view of a configuration of a pixel section according to Modification Example 5.

FIG. 16 illustrates a configuration of a pixel section according to Modification Example 5. The foregoing example embodiment exemplifies the configuration in which the organic layer 16 of the organic EL element 10 generates white light (i.e., a configuration in which, for example, a dry process such as a vacuum vapor deposition method is assumed); however, the configuration of the pixel section (i.e., the organic layer) is not limited thereto. As in the present modification example, for example, a wet process (such as printing and application) may be used to form organic layers of respective colors (i.e., organic layers 16R, 16G, and 16B). In this example, a pixel separation film 22 may have a stacked structure of a first insulating film 22A and a second insulating film 22B, and may serve as a partition wall.

Application Example

Figure 17:
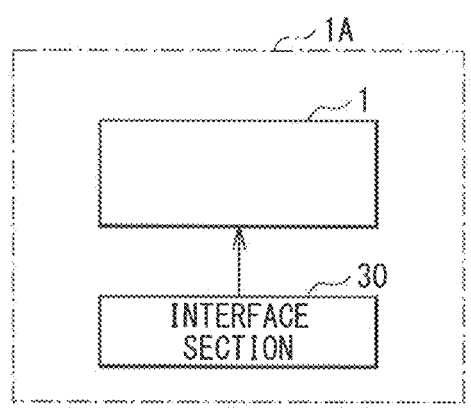
FIG. 17 is a block diagram illustrating a functional configuration of an application example.

The display unit 1 described in the foregoing example embodiment may be applied to various types of electronic apparatuses. FIG. 17 illustrates a functional block configuration of an electronic apparatus (i.e., an electric apparatus 1A) to which the display unit 1 is applied. Non-limiting examples of the electronic apparatus 1A may include a television, a personal computer (PC), a smartphone, a tablet PC, a mobile phone, a digital still camera, and a digital video camera.

The electronic apparatus 1A may include, for example, the above-described display unit 1 and an interface section 30. The interface section 30 may be an input section that receives various signals and a power supply, for example, from an external device. The interface section 30 may include a user interface such as a touch panel, a keyboard, and operation buttons, for example.

Although the description has been given hereinabove with reference to the example embodiment, the disclosure is not limited thereto, but may be modified in a wide variety of ways. For example, in the foregoing example embodiment, the description has been given to the effect that the reflector 40 of the opening H1a utilizes the difference in the refractive indexes between the first insulating film 15 and the second insulating film 18. However, it is also possible to form a reflective structure by providing a metal film on a side surface (i.e., the inclined surface PS) of the opening H1a.

Factors such as a material and a thickness of each layer, and a film-forming method as well as a film-forming condition exemplified in the foregoing example embodiment and modification examples are illustrative and non-limiting. Any other material, any other thickness, any other film-forming method, any other film-forming condition, and any other factor may be adopted besides those described above.

Further, in the foregoing example embodiment and modification examples, the description has been given with reference to the specific configuration of the organic EL element 10; however, it is not necessary to provide all the layers, and any other layer may be further provided.

Furthermore, in the foregoing example embodiment and modification examples, the description has been given of the case of the active matrix display unit; however, the disclosure may also be applied to a passive matrix display unit. Moreover, the configuration of the pixel circuit PXLC for active matrix driving is not limited to that described in the foregoing example embodiment; a capacitor element or a transistor may also be added as necessary. In this case, a necessary drive circuit may also be added, in addition to the scanning line driver 3, the signal line driver 4, and the power line driver 5, depending on alteration of the pixel circuit PXLC.

Note that the effects described herein are mere examples. The effect of the disclosure is not limited thereto, and may include other effects.

The disclosure may also have the following configurations.

(1)
A display unit provided with a plurality of pixels,
the plurality of pixels each including:
a first electrode including a plurality of sub-electrodes;
an insulating film provided on the first electrode, and having openings that face the respective sub-electrodes;
an organic layer provided in each of the openings of the insulating film, and including a light-emitting layer; and
a second electrode provided on the organic layer.

(2)
The display unit according to (1), in which the openings each include a reflector.

(3)
The display unit according to (1) or (2), in which the sub-electrodes each have a rectangular surface shape.

(4)
The display unit according to (3), in which the sub-electrodes form a stripe shape as a whole.

(5)
The display unit according to any one of (1) to (4), in which the sub-electrodes are electrically coupled together.

(6)
The display unit according to any one of (1) to (5), in which, in a selective pixel of the plurality of pixels, a portion of the sub-electrodes is cut from any other portion of the sub-electrodes.

(7)
The display unit according to any one of (1) to (6), in which the sub-electrodes each have a surface shape of a plurality of circular parts or a plurality of polygonal parts.

(8)
An electronic apparatus including a display unit,
the display unit provided with a plurality of pixels,
the plurality of pixels each including
a first electrode including a plurality of sub-electrodes,
an insulating film provided on the first electrode, and having openings that face the respective sub-electrodes,
an organic layer provided in each of the openings of the insulating film, and including a light-emitting layer, and
a second electrode provided on the organic layer.

(9)
A display unit provided with a plurality of pixels,
the plurality of pixels each including:
a first electrode including a plurality of sub-electrodes;
an insulating film provided on the first electrode, and having openings that face the respective sub-electrodes;
at least a light-emitting layer provided in each of the openings of the insulating film; and
a second electrode provided above the light-emitting layer.

In the display unit and the electronic apparatus according to one embodiment of the disclosure, even in a case where an electrical short circuit occurs between the first electrode and the second electrode in a selective pixel due to foreign matters, the first electrode including the plurality of sub-electrodes makes it possible to selectively cut a portion of a sub-electrode corresponding to the short-circuited location.

In the electronic apparatus according to one embodiment of the disclosure, image display is performed by the display unit of one embodiment of the disclosure.

According to the display unit and the electronic apparatus of one embodiment of the disclosure, in each of the pixels, the first electrode includes a plurality of sub-electrodes, and the insulating film has openings that face the respective sub-electrodes. The organic layer is provided in the openings. Even in a case where an electrical short circuit occurs between the first electrode and the second electrode, this configuration makes it possible to selectively cut a portion of a sub-electrode corresponding to the short-circuited location, and thus to perform defect repair. In other words, it is possible to suppress the dark spot (i.e., pixel defect) within a narrow range inside the pixel, and to physically separate other normal parts from a part of the dark spot to adopt the separated normal parts as the light-emitting region. This makes it possible to perform more efficient defect repair and to secure a larger light-emitting region than a configuration in which the first electrode is not divided. Hence, it becomes possible to improve image quality by suppressing lowering of luminance caused by a dark spot.

Note that the effects described hereinabove are not necessarily limitative, and may be any of the effects described in the disclosure.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. An electronic apparatus comprising a display unit, the display unit comprising a plurality of pixels, each of the plurality of pixels including:
a first electrode including a plurality of sub-electrodes and an end, wherein the end electrically connects each of the plurality of sub-electrodes, and each of the plurality of sub-electrodes is physically separated from an adjacent sub-electrode of the plurality of sub-electrodes by a slit,
an insulating film on the first electrode, wherein the insulating film includes openings that each face a corresponding sub-electrode of the plurality of sub-electrodes, and the insulating film covers the end, an organic layer in each of the openings of the insulating film, wherein the organic layer comprises a light-emitting layer, and a second electrode on the organic layer.

2. The display unit according to claim 1, further comprising a reflector in each of the openings.

3. The display unit according to claim 2, further comprising a second insulating film over the second electrode, wherein the reflector is formed based on a refractive index difference between the insulating film and the second insulating film, and the reflector comprises a sidewall angled with respect to a top surface of the first electrode.

4. The display unit according to claim 1, wherein each of the plurality of sub-electrodes has a rectangular surface shape.

5. The display unit according to claim 4, wherein each of the plurality of sub-electrodes forms a stripe shape as a whole.

6. The display unit according to claim 1, wherein, in the pixel of the plurality of pixels, a portion of a sub-electrode of the plurality of sub-electrodes is cut from any other portion of the plurality of sub-electrodes.

7. The display unit according to claim 1, wherein each of the plurality of sub-electrodes has a surface shape of a plurality of circular parts or a plurality of polygonal parts.

8. The display unit according to claim 1, wherein the organic layer is continuous across each of the openings.

9. The display unit according to claim 1, wherein the organic layer is on a top surface of the insulating film between adjacent openings.

10. The display unit according to claim 1, further comprising a color filter, wherein the color filter is configured to transmit light from the organic layer in each of the openings.

11. The display unit according to claim 1, wherein a first sub-electrode of the plurality of sub-electrodes has a length less than a length of a second sub-electrode of the plurality of sub-electrodes.

12. The display unit according to claim 1, wherein a first sub-electrode of the plurality of sub-electrodes is discontinuous.

13. The display unit according to claim 12, wherein the first sub-electrode is electrically connected to a second sub-electrode of the plurality of sub-electrodes at a first end of the first sub-electrode.

14. The display unit according to claim 13, wherein the first sub-electrode is electrically connected to the second sub-electrode at a second end of the first sub-electrode, and the second end is opposite the first end.

15. The display unit according to claim 13, wherein the first sub-electrode is electrically connected to a third sub-electrode of the plurality of sub-electrodes at a second end of the first sub-electrode, and the second end is opposite the first end.

16. The display unit according to claim 12, wherein the first sub-electrode is electrically separated from a second sub-electrode of the plurality of sub-electrodes.

17. A display unit provided with a plurality of pixels, a pixel of the plurality of pixels comprising:
a first electrode including a plurality of sub-electrodes, wherein a first sub-electrode of the plurality of sub-electrodes has a different length, measured in a first direction, from a second sub-electrode of the plurality of sub-electrodes;
an insulating film on the first electrode, wherein the insulating film includes openings that each face a corresponding sub-electrode of the plurality of sub-electrodes, and each of the openings has a same length, measured in the first direction;
at least a light-emitting layer in each of the openings of the insulating film; and
a second electrode above the light-emitting layer.

18. A display unit comprising:
a plurality of pixels, wherein a pixel of the plurality of pixels comprises:
a first electrode including a plurality of sub-electrodes and an end, wherein the end electrically connects each of the plurality of sub-electrodes, and each of the plurality of sub-electrodes is physically separated from an adjacent sub-electrode of the plurality of sub-electrodes by a slit,
an insulating film on the first electrode, wherein the insulating film includes openings that each face a corresponding sub-electrode of the plurality of sub-electrodes, and the insulating film covers the end,
an organic layer in each of the openings of the insulating film, wherein the organic layer comprises a light-emitting layer, and
a second electrode on the organic layer.

* * * * *